US008878610B2

(12) United States Patent
Shoham et al.

(10) Patent No.: US 8,878,610 B2
(45) Date of Patent: Nov. 4, 2014

(54) CURRENT CANCELING GAIN CONTROL FOR HIGH FREQUENCY WIDEBAND CROSS-COUPLED AMPLIFIERS

(71) Applicant: Intel Corporation, Santa Clara, CA (US)

(72) Inventors: Doron Shoham, Petah-Tikva (IL); Eyal Goldberger, Moshav Beherotaim (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/728,841

(22) Filed: Dec. 27, 2012

(65) Prior Publication Data
US 2014/0184329 A1  Jul. 3, 2014

(51) Int. Cl.
H03G 3/30 (2006.01)
H03G 3/00 (2006.01)

(52) U.S. Cl.
CPC ..................................... H03G 3/00 (2013.01)
USPC ........................................................ 330/254

(58) Field of Classification Search
USPC .................................................. 330/252–261
See application file for complete search history.

(56) References Cited

U.S. PATENT DOCUMENTS 7,358,809 B2 * 4/2008 Elder ............................ 330/253

* cited by examiner

Primary Examiner — Hieu Nguyen
(74) Attorney, Agent, or Firm — Ellis B. Ramirez; Prass LLP

(57) ABSTRACT

An embodiment of the present invention provides a configuration of a cross-coupled common-source differential amplifier stage which enables performing a gain step down (attenuation) while maintaining good step flatness over a large relative bandwidth.

19 Claims, 3 Drawing Sheets

CURRENT CANCELING GAIN CONTROL FOR HIGH FREQUENCY WIDEBAND CROSS-COUPLED AMPLIFIERS

BACKGROUND

The present invention relates generally to amplifier circuits, and more specifically to amplifier circuits for high frequency operation having a wide input range.

Low noise amplifier (LNA) that use differential amplifiers are often used in high performance analog and mixed-signal integrated circuits, as part of a buffer or gain block. An output of a differential amplifier is a measure of the difference between a pair of input signals, so that if the differential amplifier is made of matched transistor devices (e.g., ones that are structural replicates of each other and, accordingly, exhibit very similar DC and AC electrical characteristics), then common mode noise occurring at the inputs of the amplifier or the power supply is significantly reduced at its output. The difficulty in designing a multi-band LNA circuit comes from the fact that it has to provide different functions at different operating frequencies. Therefore, to design a multi-band amplifier, it must satisfy different operating bandwidths at different standards. In order to meet the trends of increasingly standards, the operation bandwidths and gain flatness performance of the multi-band LNA must be improved. The amplifier must be able to provide input matching, wide-band interference rejection and maximum gain flatness performance. However, conventional LNAs can not meet the required of multi-standard function or wide-band solution.

Thus, a critical need is prevalent for apparatus, systems and methods that enable differential amplifiers, especially when used in LNAs, to overcome at least the gain flatness limitations that limit the suitability to wideband applications.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
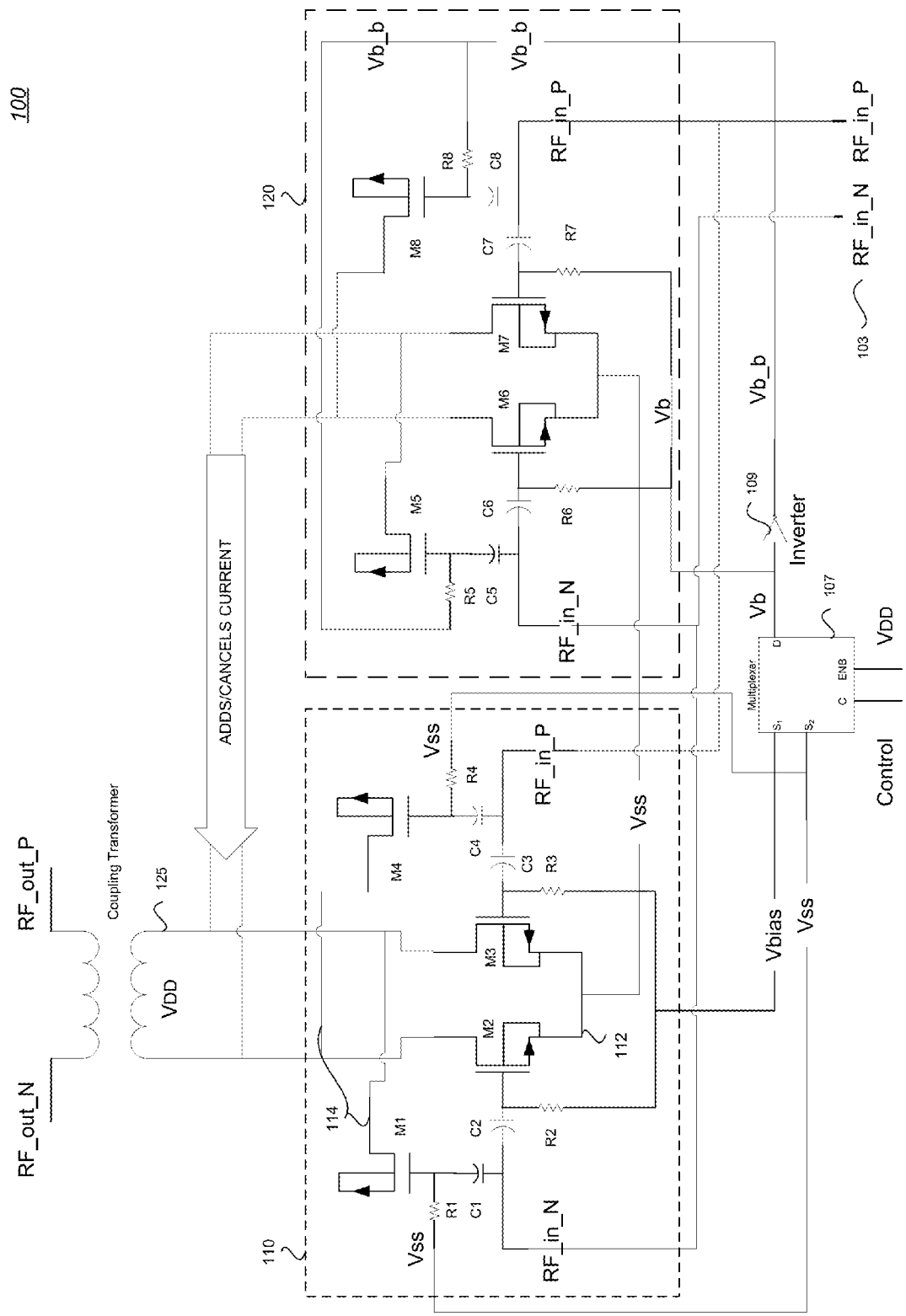
FIG. 1 is a block diagram of a cross-coupled common-source differential amplifier with current canceling in accordance to an embodiment.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the preset invention may be practiced without these specific details. In other instances, well-known methods, procedures, components and circuits have not been described in detail so as not to obscure the present invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations. The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

Referring to FIG. 1 which illustrates a current canceling amplifier applicable to any type of device technologies, such as high frequency transceivers, wideband transceivers, low noise amplifiers (LNAs), variable gain amplifiers (VGAs), active antennas, phased arrays, phase shifters, and the like.

FIG. 1 is a block diagram of a cross-coupled (CC) common-source (CS) differential amplifier 100 with current canceling in accordance to an embodiment. The illustrated CCCS differential amplifier 100 comprise a first amplifying stage 110, a second amplifying stage 120, coupling transformer 125 at the output port, controller such as multiplexer 107, and input port 103.

In order to get gain attenuation, the stage is split into two sub-stages 110 and 120 that are shorted at input and output. Each stage (illustrated as stage 110 and stage 120) includes a common-source (CS) differential stage (M2,M3, M6, M7) with cross-couple (CC) transistors (M1,M4,M5, M8) and DC block capacitors (C1, C4, C5, C8, C2, C4, C6, C7), along with big resistors for biasing (R1, R4, R5, R8, R2, R3, R6, R7). At each sub-stage such as stage 110 all four (4) transistors (M1, M2, M3, M4) are the same size, although two are common source (CS) and the other two act as their cross-couple (CC) capacitors. As illustrated, CC transistors (M1, M4, M5, and M8) are MOScaps and all DC block capacitors (C1, C4, C5, C8, C2, C4, C6, C7) are MOMcaps. The importance of all transistors to be same and all MOMcaps to be same (i.e., matched and symmetrical) is for having exact same path of the RF signal when operating in full gain or attenuated gain (when the current canceling is occurring). The DC block capacitors are connected between the gate of the transistors and an input terminal which is connected to a signal source such as an active antenna, and a bias resistor (R2, R3, R6, R7) to supply bias voltage to the gate transistor is connected as gating voltage (Vbias and Vb). Since the input impedance of the differential amplifier circuit depends on the bias resistor (R2, R3, R6, R7), the resistance value of this bias resistor cannot be reduced below a certain value. Thus one function of the cross-coupling capacitor is to prevent supply back to the signal source a DC potential established at the gate of the transistor, which DC potential is determined by the resistance value of the bias resistor.

In operation, stage 110 is always "ON" (Vbias='1') while stage 120 has two (2) working modes as selected by a control device such as multiplexer 107. The first mode is a gain attenuation mode and the second mode is a full gain mode which is normal operation at full gain. In the second mode the common source (CS) differential pair transistors (M6 and M7) are "ON" (Vb='1') and the cross-coupled (CC) transistors (M5 and M8) are "OFF" (Vb_b='0'). Full gain is achieved because the current at the coupling transformer, output terminal 125, are in phase causing an accumulation of the output from stage 110 and stage 120.

In the gain attenuation mode, first mode, the CS transistors (M6 and M7) are "OFF" (Vb='0') and the CC transistors (M5 and M8) "ON" (Vb_b='1') to cause a current canceling/reduction at output terminal 125. The gain attenuation is caused by the fact that in this mode the CC transistors (M5 and M8), which are connected with a cross compared to stage 110, now carry the opposite phase current that resist the main current (i.e., output of stage 110 which is always "ON"), therefore creating "current canceling" that is translated to gain attenuation. Note that the CS transistors (M6 and M7) that are now in "OFF" mode act as the CC capacitors (MOS-caps), that is, the CS transistors (M6 and M7) and CC transistors (M5 and M8) of stage 120 actually switched their role in this operating mode.

The gain attenuation value is determined by the ratio between the stage 110 transistors (M1, M2, M3, and M4) width to the stage 120 transistors (M5, M6, M7, and M8) width. In order to change the attenuation value, one must "transfer" width from left side (stage 110) to the right side (stage 120) but keep same total width (to keep total gain unchanged). As bigger stage 120 transistor width, the current canceling will be stronger, i.e. bigger attenuation.

Selectively controlling stage 120 we can see that at all time, there is same size of transistors at "ON" and at "OFF" modes. This fact is important, because it creates constant input impedance towards the former amplifier stage, enabling constant impedance matching and therefore the power gain curve will have same behavior over frequency at different gain modes, i.e., good gain step flatness. This flatness is evident from the graph at FIG. 3. The Vb signal is therefore Vbias or Vss, being controlled by a one (1) bit control signal, using a simple MUX cell such as multiplexer 107, digital-to-analog converter, or duty cycle logic circuit. In order to create Vb_b=NOT (Vb) there is a need for an inverter cell such as inverter 109.

Figure 2:
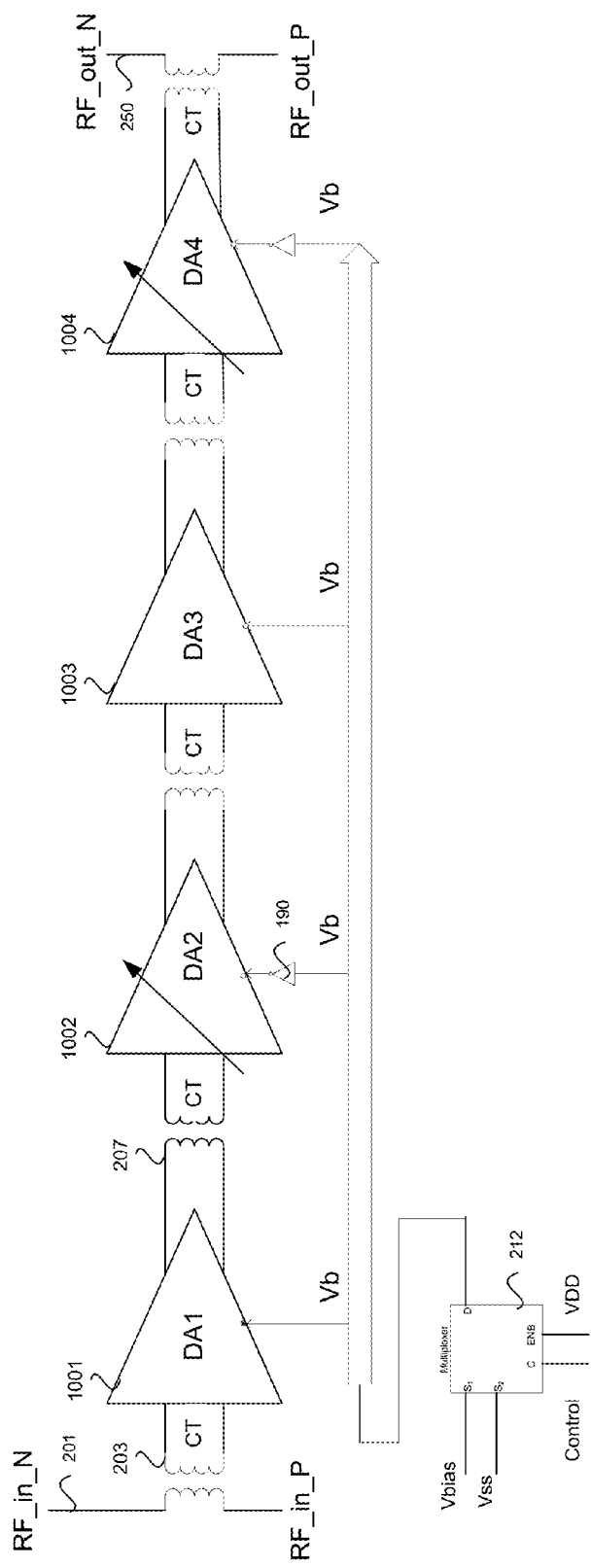
FIG. 2 is a schematic diagram of the low noise amplifier (LNA) with a cross-coupled common-source differential amplifier in accordance to an embodiment.

FIG. 2 is a schematic diagram showing the inputs and outputs of a differential LNA. The LNA of FIG. 2 is an integrated differential low noise amplifier and as such has two inputs 201 primarily RF_in_P and RF_in_N. For most differential signals, a signal p applied to RF_in_P will be 180 degrees out of phase with (i.e. of opposite phase to) a signal n applied to RF_in_N. The LNA of FIG. 2 has two outputs 250, one for positive components of the differential signal and one for negative components of the differential signal: RF_out_N and RF_out_P. In some implementations the two outputs may be connected to provide a single output. The LNA of FIG. 2 is powered by a voltage supply VDD and is connected to ground. The voltage supply supplies a DC voltage. A differential amplifier typically has two parts, one for a first differential signal component, e.g. p, and one for a second differential signal component, e.g. n. These parts will be referred to herein as the positive or "plus" side of the differential amplifier and the negative or "minus" side of the differential amplifier. Each side of the differential amplifier will have a corresponding input and output, e.g. for a signal p, the p side will have input RF_in_P and output RF_out_P, likewise for a signal n the n side will have input RF_in_N and output RF_out_P. In some embodiments the p and n sides of the differential amplifier are coupled at the outputs, for example via a coupling transformer.

Figure 3:
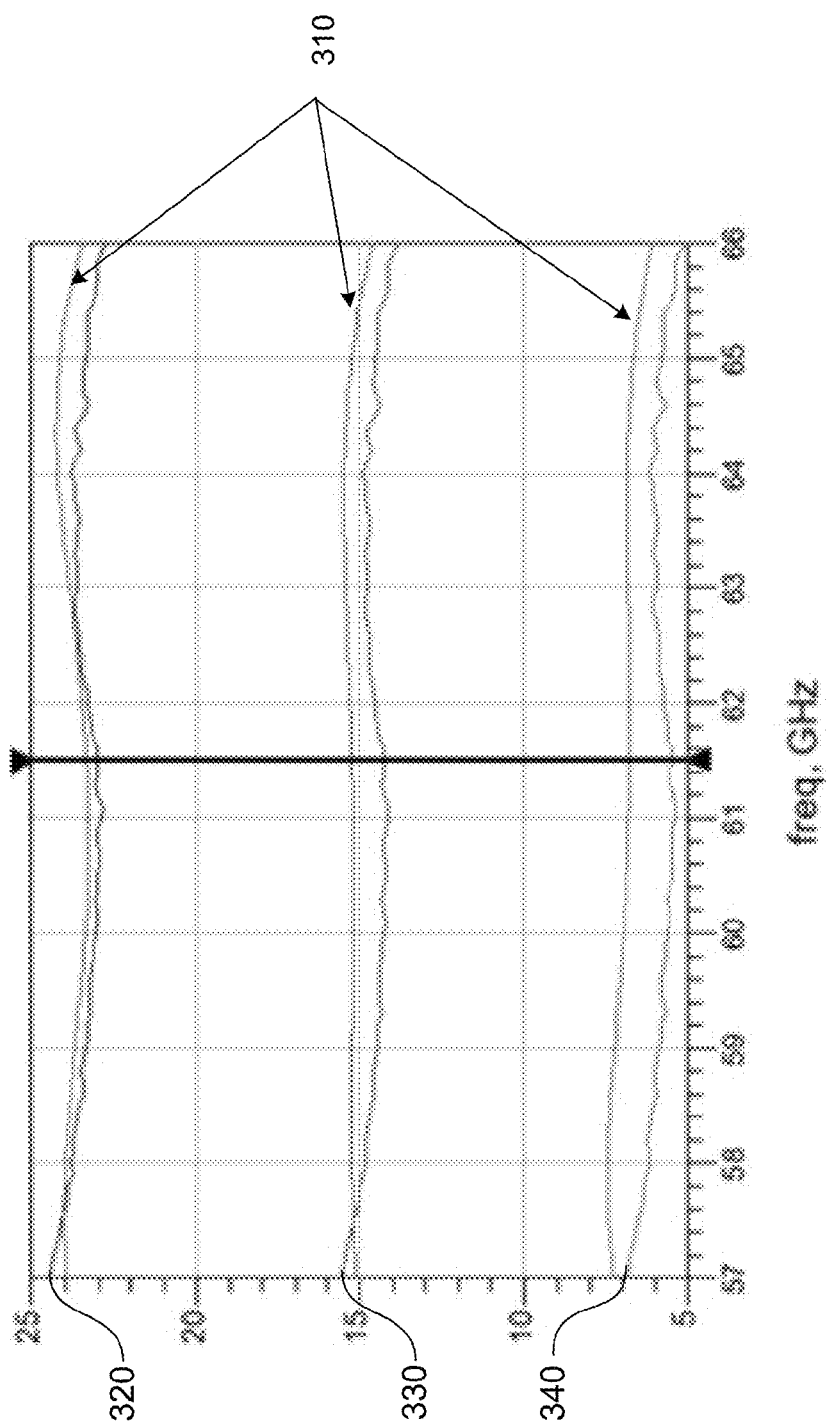
FIG. 3 is a graph of gain step flatness, wherein the X-axis corresponds to frequency and the Y-axis is the gain of the LNA circuit of FIG. 2.

LNA circuit 200 employs the concepts enumerated with reference to the cross-coupled (CC) common-source (CS) differential amplifier 100. The LNA design includes four (4) amplifying stages (DA1, DA2, DA3, and DA4) with transformers (e.g., coupling transformer 207 and input coupling transformer 203) between them for impedance matching. Stages 1 and 3 (DA1 and DA3) are regular CS with CC stages like stage 110, while stages 2 and 4 are automatic gain control (AGC) stages like stage 120 connected to stage 110 as in FIG. 1 using the idea as explained above. It should be noted that a programmable stage like stage 120 could be used for all the amplifying stages and their functionality could be selected on the fly by a combination of control device such as multiplexer 212 inverter 190, and data line to carry the control code. FIG. 3 is a graph showing the gain and AGC results comparing measured (320, 330, and 340) and simulation 310 values.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

We claim:

1. A circuit to amplify a differential input signal, the circuit comprising:
   a plurality of input stages each having cross-coupled transistors, and first and second transistors coupled as a common source differential pair to cooperate in amplifying the differential input signal; and
   a controller operable to apply a mode signal to the cross-coupled transistors of at least one input stage to selectively activate the at least one input stage in a first mode or to selectively deactivate the at least one input stage in a second mode;
   wherein gain and an attenuation provided by the at least one input stage is dependent on an applied mode signal;
   wherein the first mode is a gain attenuation mode;
   wherein the controller is configured to turn ON the cross-coupled transistors and turn OFF the common source (CS) differential pair at the at least one input stage in the gain attenuation mode.

2. The circuit in accordance to claim 1, wherein the second mode is a full gain mode.

3. The circuit in accordance to claim 2, wherein the controller is configured to turn OFF the cross-coupled transistors and turn ON the common source differential pair at the at least one input stage in the full gain mode.

4. The circuit in accordance to claim 2, wherein the transistors at the plurality of input stages are of the same size.

5. The circuit in accordance to claim 2, wherein the gain attenuation is caused by the cross-coupled transistors at the at least one input stage carrying an opposite phase current that resists a main current.

6. The circuit in accordance to claim 2, wherein the controller is at least one of multiplexer, digital-to-analog converter, or duty cycle logic circuit.

7. A low noise amplification system comprising:
   a plurality of low noise amplifiers (LNAs) connected in series, each LNA comprising:

an amplifier branch operating in a first or second mode in response to a control code, wherein the amplifier branch comprises cross-coupled transistors, and transistors coupled as a common source differential pair to amplify a differential input signal from an input terminal and output to an output terminal;

wherein gain and an attenuation provided by a low noise amplifier is dependent on an applied control code;

wherein the first mode is a gain attenuation mode;

wherein the control code turns ON the cross-coupled transistors and turns OFF the common source differential pair in the gain attenuation mode.

8. The system in accordance to claim 7, wherein the second mode is a full gain mode.

9. The system in accordance to claim 8, wherein the control code turns OFF the cross-coupled transistors and turns ON the common source differential pair in the full gain mode.

10. The system in accordance to claim 8, wherein the transistors are of the same size.

11. The system in accordance to claim 7, wherein the gain attenuation is caused by the cross-coupled transistors carrying an opposite phase current that resists a main current from the common source differential pair.

12. The system in accordance to claim 8, wherein the control code is from is at least one of multiplexer, digital-to-analog converter, or duty cycle logic system.

13. A method comprising:

amplifying a differential input signal with a plurality of input stages each having cross-coupled transistors, and first and second transistors coupled as a common source differential pair to cooperate in amplifying the differential input signal; and applying a mode signal to the cross-coupled transistors of at least one input stage to selectively activate the at least one input stage in a first mode or to selectively deactivate the at least one input stage in a second mode;

wherein gain and an attenuation provided by the at least one input stage is dependent on an applied mode signal;

wherein gain and an attenuation provided by an input stage is dependent on an applied mode signal;

wherein the first mode is a gain attenuation mode;

wherein the controller is configured to turn ON the cross-coupled transistors and turn OFF the common source differential pair at the at least one input stage in the gain attenuation mode.

14. The method in accordance to claim 13, wherein the second mode is a full gain mode.

15. The method in accordance to claim 14, wherein the controller is configured to turn OFF the cross-coupled transistors and turn ON the common source differential pair at the at least one input stage in the full gain mode.

16. The method in accordance to claim 14, wherein the transistors at the plurality of input stages are of the same size.

17. The method in accordance to claim 13 wherein the gain attenuation is caused by the cross-coupled transistors at the at least one input stage carrying an opposite phase current that resists a main current.

18. The method in accordance to claim 14, wherein the controller is at least one of multiplexer, digital-to-analog converter, or duty cycle logic method.

19. A circuit to amplify a differential input signal, the circuit comprising:

a plurality of input stages each having cross-coupled transistors, first and second transistors coupled as a common source differential pair to cooperate in amplifying the differential input signal, and wherein the transistors at the plurality of input stages are of the same size; and a controller operable to apply a mode signal to the cross-coupled transistors of at least one input stage to selectively activate the at least one input stage in a first mode or to selectively deactivate the at least one input stage in a second mode, wherein the controller is at least one of multiplexer, digital-to-analog converter, or duty cycle logic circuit;

wherein gain and an attenuation provided by the at least one input stage is dependent on an applied mode signal;

wherein the first mode is a gain attenuation mode;

wherein the second mode is a full gain mode;

wherein the controller is configured to turn ON the cross-coupled transistors and turn OFF the common source (CS) differential pair at the at least one input stage in the gain attenuation mode.

* * * * *